(12) United States Patent
Grant et al.

(10) Patent No.: US 6,220,869 B1
(45) Date of Patent: Apr. 24, 2001

(54) AREA ARRAY CONNECTOR

(75) Inventors: John L. Grant, Sherborn; Herbert J. McEvoy, North Attleboro, both of MA (US)

(73) Assignee: Airborn, Inc., Georgetown, TX (US)

( * ) Notice: Subject to any disclaimer, the term of this patent is extended or adjusted under 35 U.S.C. 154(b) by 0 days.

(21) Appl. No.: 09/315,439

(22) Filed: May 20, 1999

(51) Int. Cl.⁷ .................................................. H01R 9/09
(52) U.S. Cl. .................................................. 439/66
(58) Field of Search ........................ 439/66, 91, 71, 439/591, 331, 72, 73, 82

(56) References Cited

U.S. PATENT DOCUMENTS

| | | |
|---|---|---|
| 4,354,729 | 10/1982 | Grabbe et al. . |
| 4,513,353 | 4/1985 | Bakermans et al. . |
| 4,793,814 | 12/1988 | Zifcak et al. . |
| 4,927,369 | * 5/1990 | Grabbe et al. .................. 439/66 |
| 5,462,440 | * 10/1995 | Rothenberger .................. 439/66 |
| 5,713,744 | * 2/1998 | Laub .................................. 439/71 |
| 5,984,693 | * 11/1999 | McHugh et al. ................ 439/66 |

* cited by examiner

Primary Examiner—Khiem Nguyen
Assistant Examiner—J. F. Duverne
(74) Attorney, Agent, or Firm—Jenkens & Gilchrist, A Professional Corporation

(57) ABSTRACT

Disclosed is an area array connector adapted to connect contact pads on one generally planar circuit element to corresponding contact pads on another generally planar circuit element. The connector has an insulative contact mounting sheet having a plurality of contact mounting apertures therein. A plurality of electrically conducting contacts are mounted in the contact mounting apertures, each contact having contact pad engaging legs resiliently projecting away from opposite faces of the contact mounting sheet. Two insulative contact securing sheets are provided, one laminated to each face of the contact mounting sheet, each contact securing sheet having apertures therein to accommodate the resiliently projecting legs of the contacts.

7 Claims, 10 Drawing Sheets

AREA ARRAY CONNECTOR

This invention relates to area array connectors which are adapted to connect the contact pads on one generally planar circuit element, such as a printed wiring board, to corresponding contact pads on another generally planar circuit element.

SUMMARY OF THE INVENTION

In many electronic applications, compactness of the equipment, both overall and in detail, is an important goal. One manner of achieving this is to stack printed wiring boards, or printed circuit boards, one upon another, and electrically connecting them together face-to-face instead of in a more space consuming arrangement of daughter printed circuit boards being connected together through current paths routed through a motherboard.

In order to make use of such a compact arrangement, it is necessary that the face-to-face connection be assuredly made both electrically and mechanically, and area array connectors are needed to connect corresponding contact pads on adjacent printed circuit boards.

BACKGROUND OF THE INVENTION

In accordance with the invention, an area array connector is provided which is made up of the required number of electrically conductive connector elements or contacts carried in a three-layer laminated insulative housing. The contacts project from either side of the housing and are positioned to engage contact pads on printed circuit boards in a stack, the connector being interleaved between adjacent printed circuit boards.

More specifically, in accordance with the invention, there is provided an area array connector adapted to connect the contact pads on one generally planar circuit element, such as a printed wiring board, to the corresponding contact pads on another generally planar circuit element or printed circuit board. The connector includes an insulative contact mounting sheet having a plurality of contact mounting apertures in it. A plurality of electrically conducting contacts are mounted in the contact mounting apertures; each contact has contact pad engaging legs resiliently projecting away from opposite faces of the contact mounting sheet. Two insulative contact securing sheets are provided; one laminated to each face of the contact mounting sheet. Each contact securing sheet has apertures in it to accommodate the resiliently projecting legs of said contacts.

In a preferred embodiment of the invention, each of the electrically conducting contacts has a base leg adapted and proportioned to fit in and engage the contact mounting apertures of the contact mounting sheet and two pad engaging legs which are cantilevered resiliently outwardly from the base leg in opposite directions. In accordance with one preferred embodiment, it is preferred that the pad engaging legs of the contacts have a shorter linear extent than the base legs of the contacts. In such embodiment, in order to assure that the contacts are securely held in position, it is preferred that the contact mounting apertures are each greater in linear extent than the corresponding apertures of the contact securing sheets. In accordance with another embodiment, it is preferred that the pad engaging legs of the contacts have substantially the same length as the base legs of the contacts. In this embodiment, it is preferred that the thickness or width of at least part of the base legs be greater than the thickness or width of the pad engaging legs. It is further preferred in all embodiments that the contact mounting apertures are each greater in area than the corresponding apertures in the contact securing sheets.

In accordance with the invention, it is preferred that the contacts are aligned with one another in a staggered pattern, or alternately that the contacts are aligned with one another in a rectangular array, in which the spacing between adjacent contact projecting leg ends is less than the length of a projecting contact leg, and further in which the contacts are skewed with respect to the alignment of the rectangular array to accommodate the length of the projecting contact leg.

In accordance with another aspect of the invention, an assembly of a plurality of generally planar circuit elements is provided. The circuit elements have contact pads on at least one surface thereof, and are stacked one upon another, with area array connectors being interleaved between adjacent circuit elements. The area array connectors are made up of an insulative contact mounting sheet which has a plurality of contact mounting apertures therein, a plurality of electrically conducting contacts mounted in the contact mounting apertures, each contact having contact pad engaging legs resiliently projecting away from opposite faces of the contact mounting sheet, and two insulative contact securing sheets, one laminated to each face of the contact mounting sheet. Each contact securing sheet has apertures therein to accommodate the resiliently projecting legs of the contacts. Framing means are provided for holding the assembly together and for establishing pressure contact between the contact pads and corresponding contact pad engaging legs. It is preferred to have spacer means mounted in the sheets to establish and maintain a uniform thickness of the connector.

In accordance with still another aspect of the invention, there is provided a method for making an area array connector adapted to connect contact pads on one generally planar circuit element to corresponding contact pads on another generally planar circuit element that includes providing an insulative generally planar contact mounting sheet, selecting positions on the contact mounting sheet at which contacts are desired to be mounted, and laser machining contact-accommodating apertures in the contact mounting sheet at said selected positions thereon. Contacts of conducting material are formed, each contact having a mounting leg for fitting into and engaging the contact-accommodating apertures, and further having contact pad engaging legs resiliently projecting away from opposite faces of the contact mounting sheets. The contacts are mounted in the contact-accommodating apertures. Two insulative contact securing sheets are provided having apertures laser machined therein which are registerable with the projecting legs of contacts mounted in the contact mounting sheet. One of the apertured contact securing sheets is adhesively laminated to each face of the contact mounting sheet.

DESCRIPTION OF PREFERRED EMBODIMENTS

Figure 1:
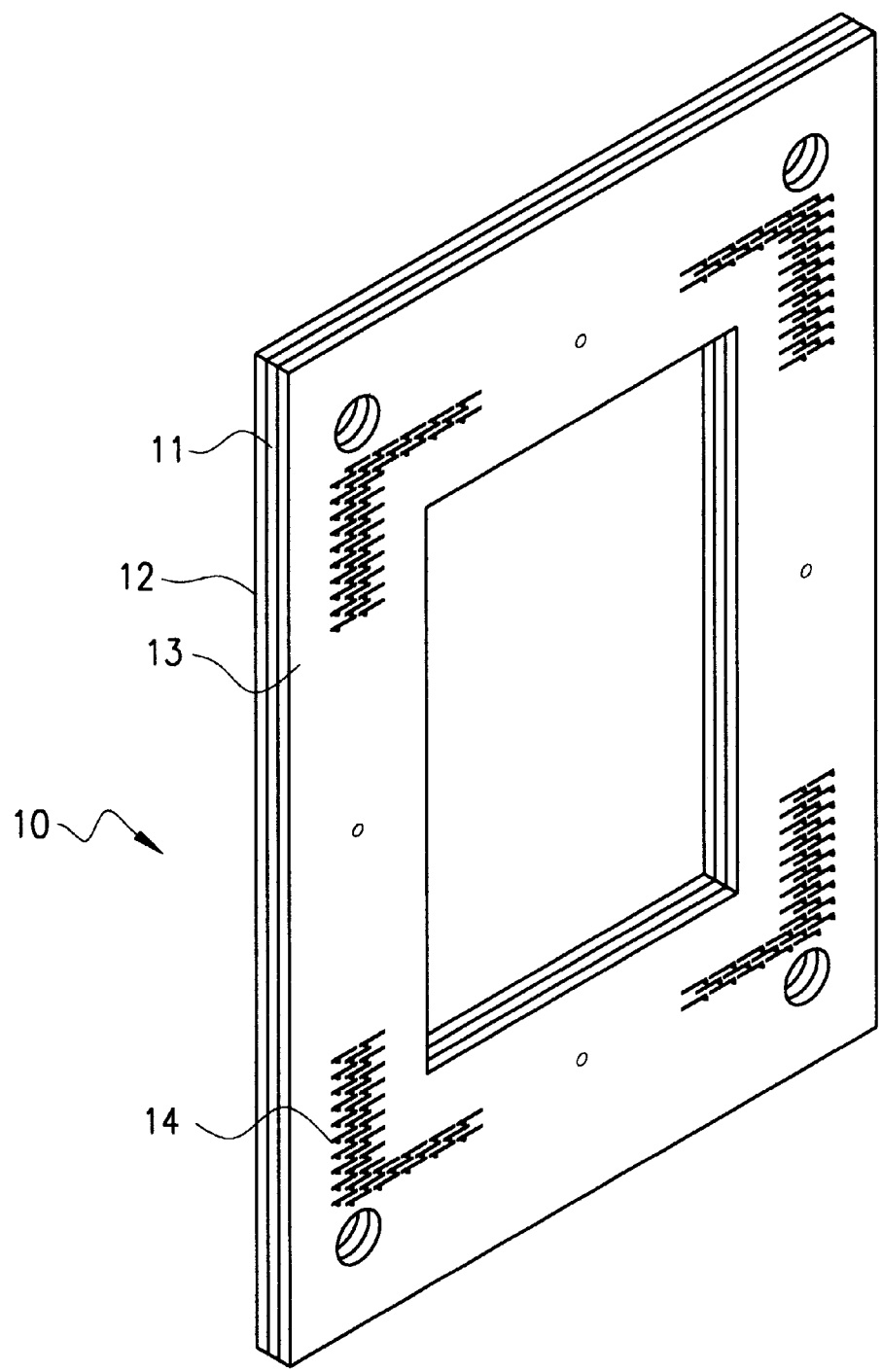
FIG. 1 is a perspective view of the area array connector of the invention.

In FIG. 1 there is shown a connector of the invention designated generally as 10. It is made up of three generally planar sheets, the center sheet being a contact mounting sheet 1, and the contact securing sheets 12 and 13 laminated to the sheet 11 on either face thereof. An array of contacts 14 is arranged on the connector as is indicated very diagrammatically in FIG. 1, but which is shown on a larger scale in succeeding figures. The sheets 11, 12 and 13 are all made of insulative materials, such as plastics (for example, phenolic, Teflon or Duroid (polytetrafluoroethylenes), diallyl phthalate (DAP)) or ceramics (for example, aluminum oxide or beryllium oxide), and the sheets need not be all formed of the same material.

The laminated sheets 11, 12 and 13 are adhesively secured to one another by a suitable adhesive, such as epoxy or acrylic adhesives.

Figure 2:
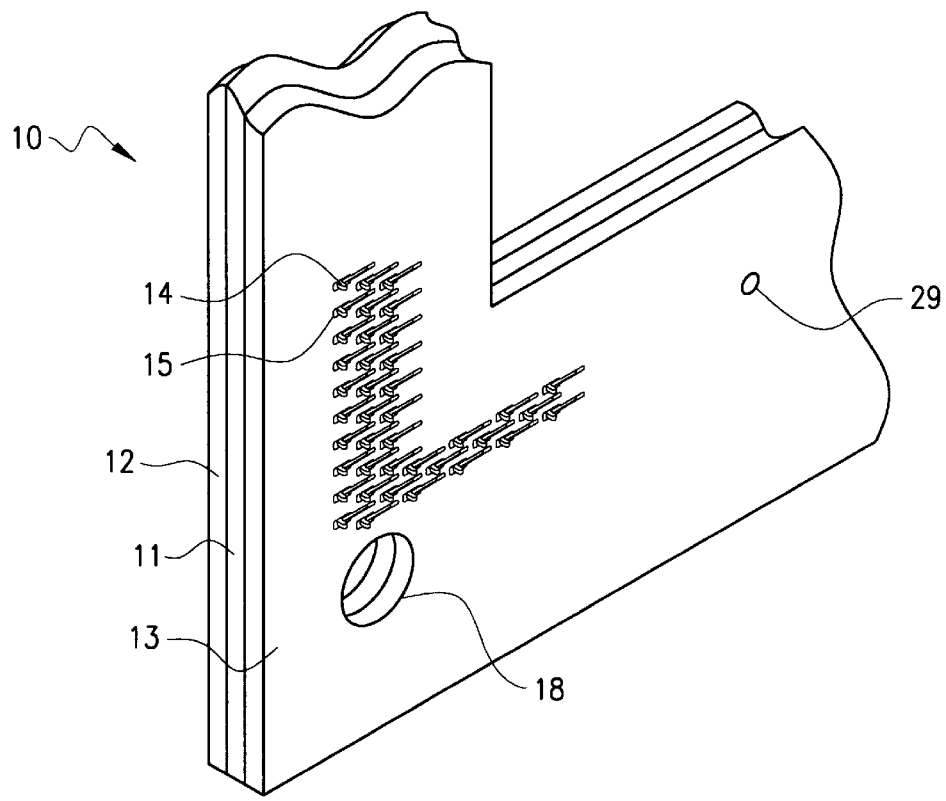
FIG. 2 is an enlarged perspective view of a corner of the area array connector of FIG. 1.
Figure 3:
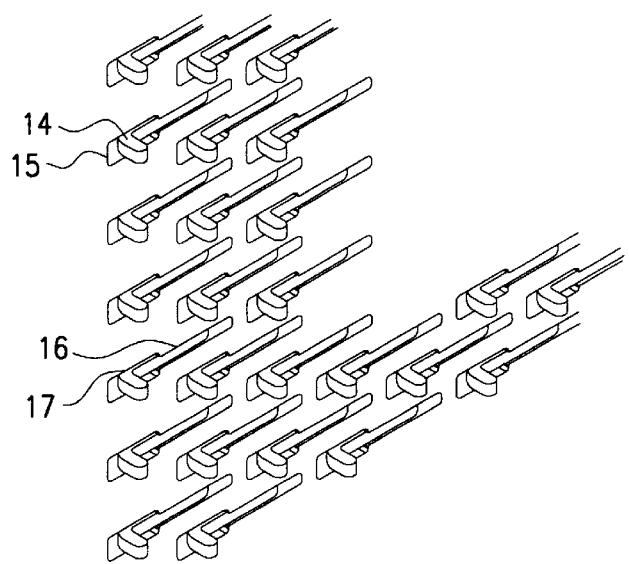
FIG. 3 is a still further enlarged view of a portion of the connector of FIG. 1.

Attention is now directed to FIGS. 2 and 3, which show on different scales contacts protruding through apertures in contact securing sheet 13. The contacts are designated 14, and it can be seen that they are made up of a contact leg 16, which projects into the aperture 15, and integral with it a contact head 17, which also projects through the aperture 15. The contact head 17 is at the cantilevered end of the contact leg 16, as will appear in greater detail below.

The laminated connector 10 has holes 18 in it positioned to pass framing bolts or studs (not shown) for building up an assembly of printed circuit boards and array connectors and for aligning of the area array connectors with the printed circuit boards that are interleaved with them.

Figure 4:
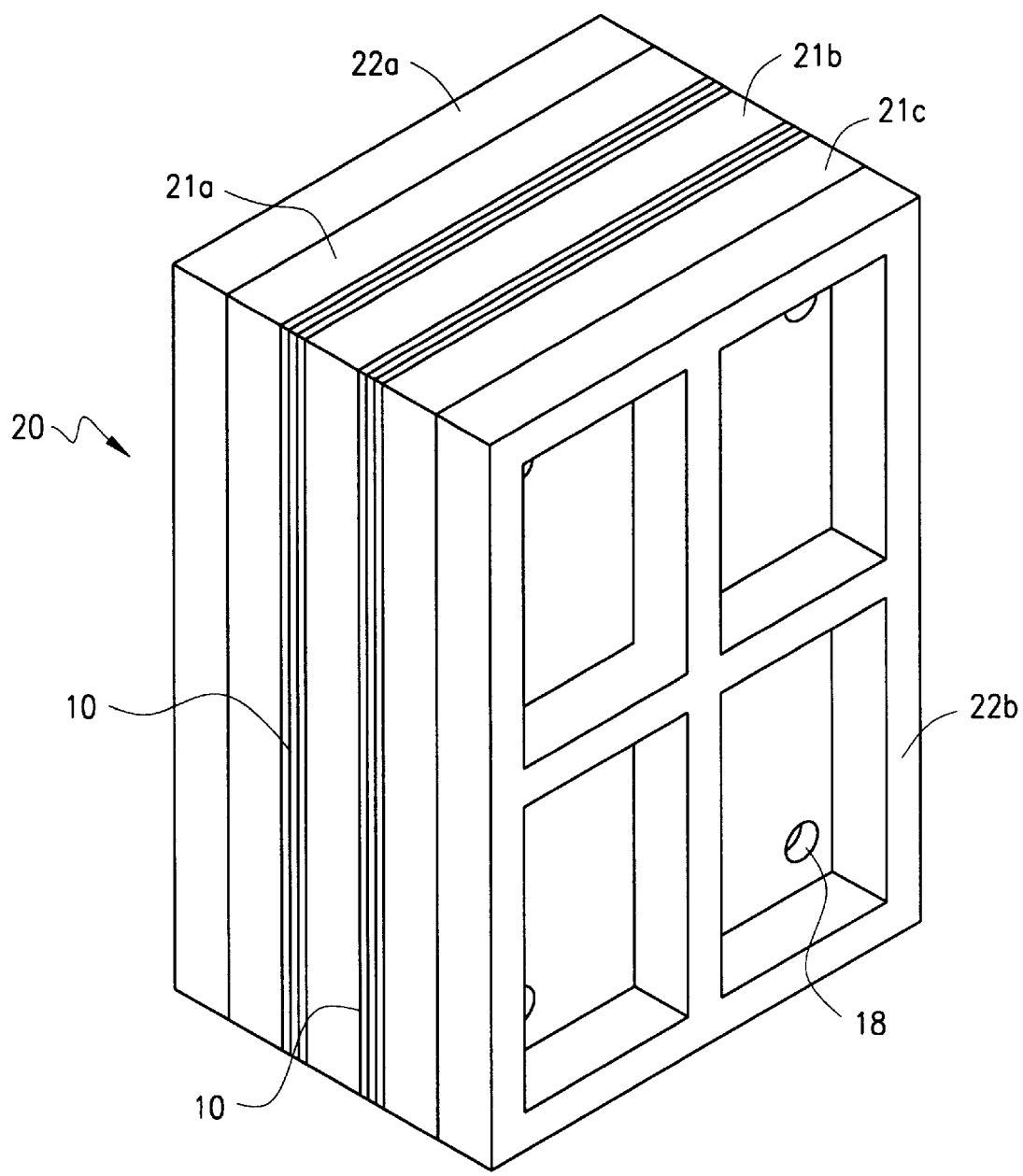
FIG. 4 is a perspective view of an assembly of printed circuit boards and area array connectors of the invention.
Figure 5:
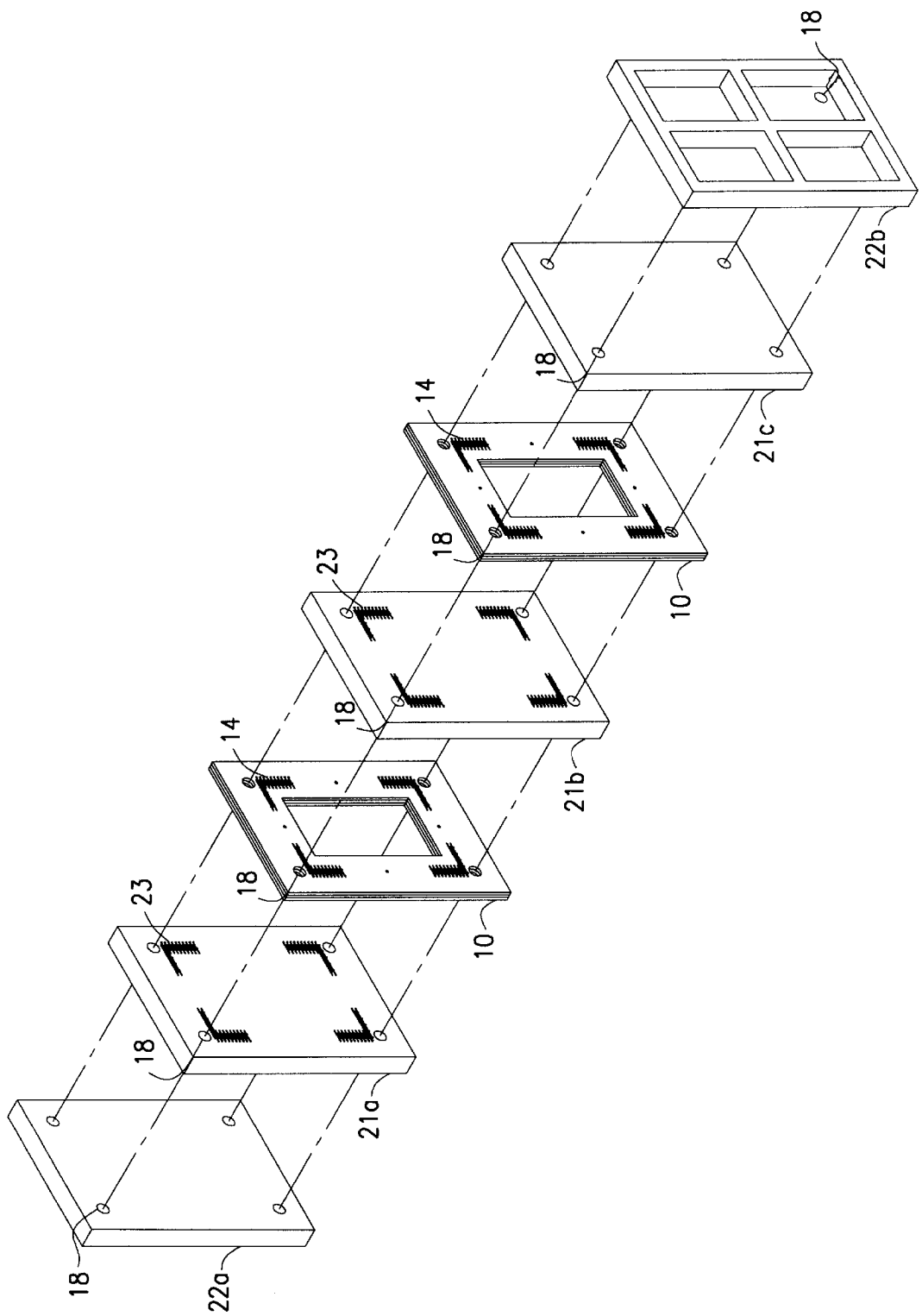
FIG. 5 is an exploded view of the assembly of FIG. 4.

FIGS. 4 and 5 show an assembly designated generally 20. It is formed of printed circuit boards designated as 21a, 21b and 21c. The circuit boards are of the kind having electric contact pads on at least one surface thereof. Interleaved between the printed circuit boards are area array connectors 10. The assembly is held together by means of framing members 22a and 22b. Bolts or other fastening means (not shown) pass through holes 18 in the framing members, the printed circuit boards, and the area array connectors.

The parts of the assembly of FIG. 4 just discussed are shown in exploded form in FIG. 5 with the same reference characters being used. The before-mentioned contact pads on the printed circuit boards are designated 23 in FIG. 5. The contacts 14 on the connectors 10 are positioned to align with the contact pads 23.

Figure 6:
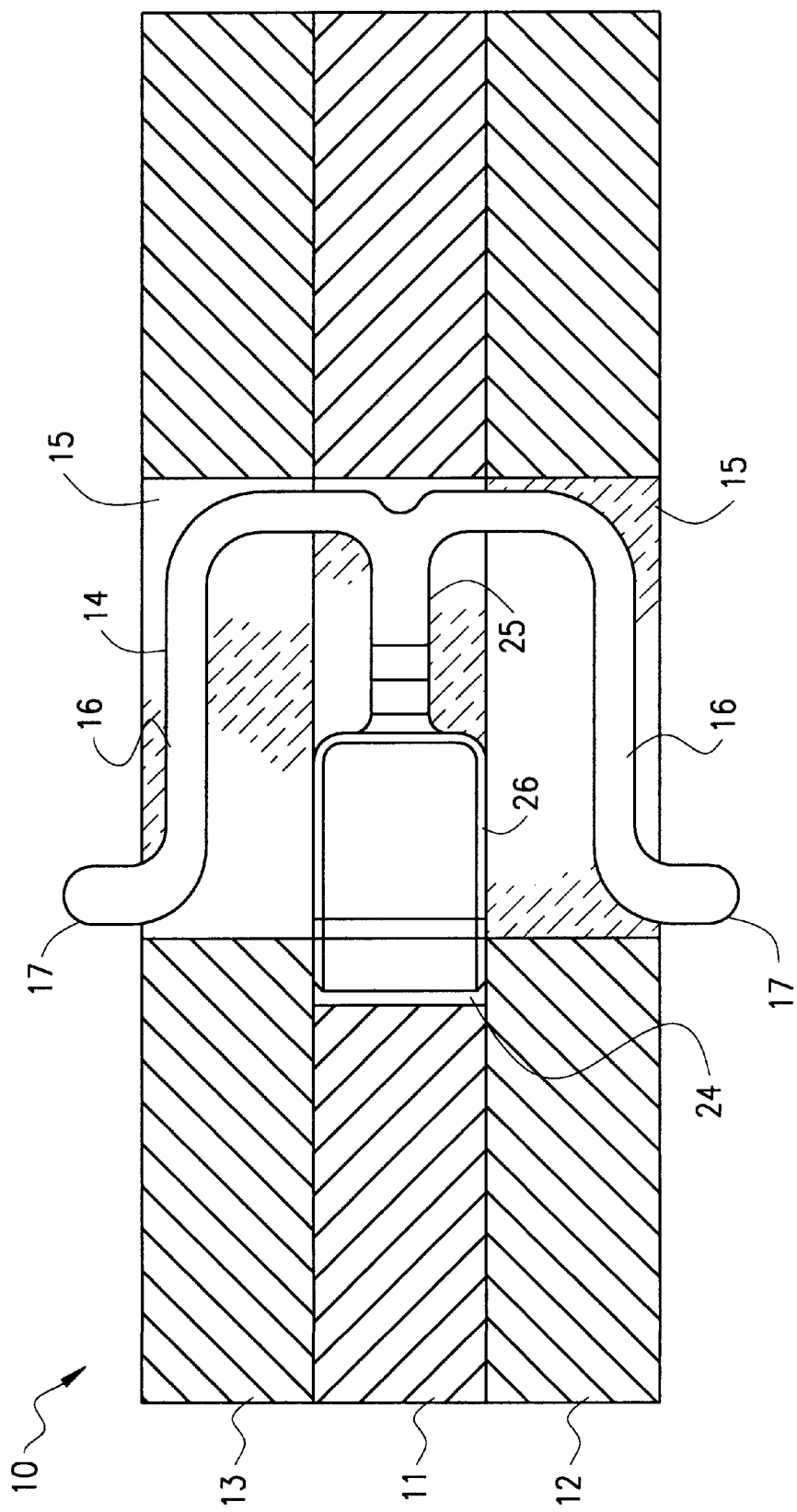
FIG. 6 is a cross-sectional view, partly in elevation, of one embodiment of the connector of the invention showing in enlarged scale a contact mounted in the insulative housing formed of three insulative sheets.

FIG. 6 is a sectional view partly in elevation transversely through the connector 10 at the location of a contact 14. From this figure, it can be seen that the contact mounting sheet 11 has a slot 24 in it, which is generally aligned with slots or apertures 15, but which is longer or greater in linear dimension than the apertures 15 in the contact securing sheets 13 and 12. FIG. 6 also shows that the contact 14 is generally E-shaped, having a base leg 25 centrally located in the E-shape. Base leg 25 terminates in an enlarged aperture engaging portion 26 integrally formed therewith. The contact 14 has two contact pad engaging legs 16 resiliently cantilevered or projecting away from the base leg. The contact pad engaging legs 16 terminate in contacting heads 17. The legs and heads taken together are proportioned so that the contact legs resiliently project outwardly from the contact securing sheets, as well as the contact mounting sheet, yet can be resiliently moved back into the laminate upon engaging a contact pad on an adjacent printed circuit board with the contacting head almost flush with the surface of the contact securing sheet.

Figure 7:
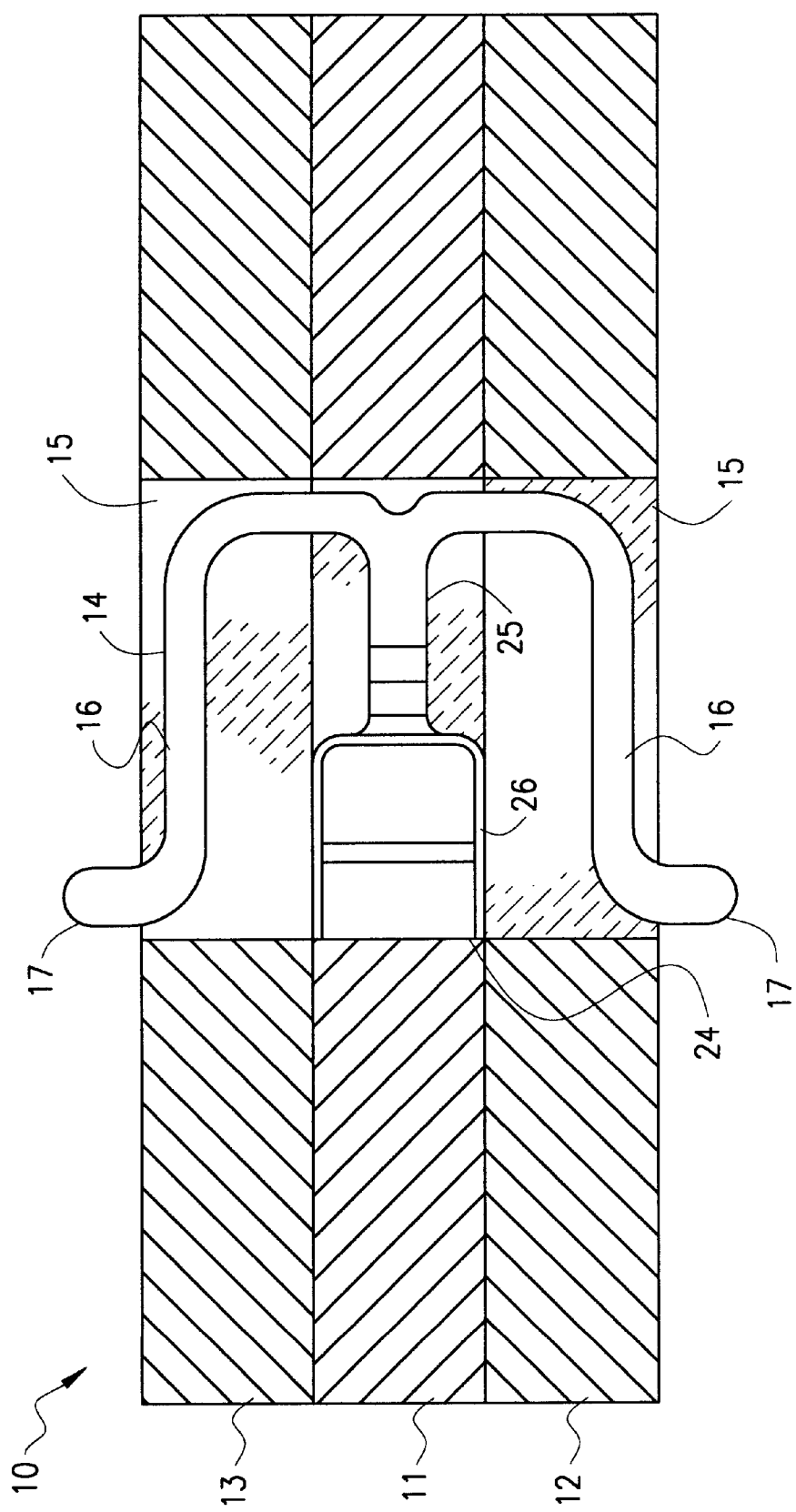
FIG. 7 is a cross-sectional view, partly in elevation, similar to FIG. 6, of another embodiment of the invention on the same scale as FIG. 6.

FIG. 7 is similar to FIG. 6, but illustrates another preferred embodiment of the connector of the invention. Corresponding parts in these two figures are given the same reference characters. In FIG. 7, the slot 24 in contact mounting sheet 11 is substantially the same length as apertures 15. Slot 24 is, however, wider than apertures 15, and the surfaces of contact securing sheets 12 and 13 thus capture the enlarged portion 26 of base leg 25.

Figure 8:
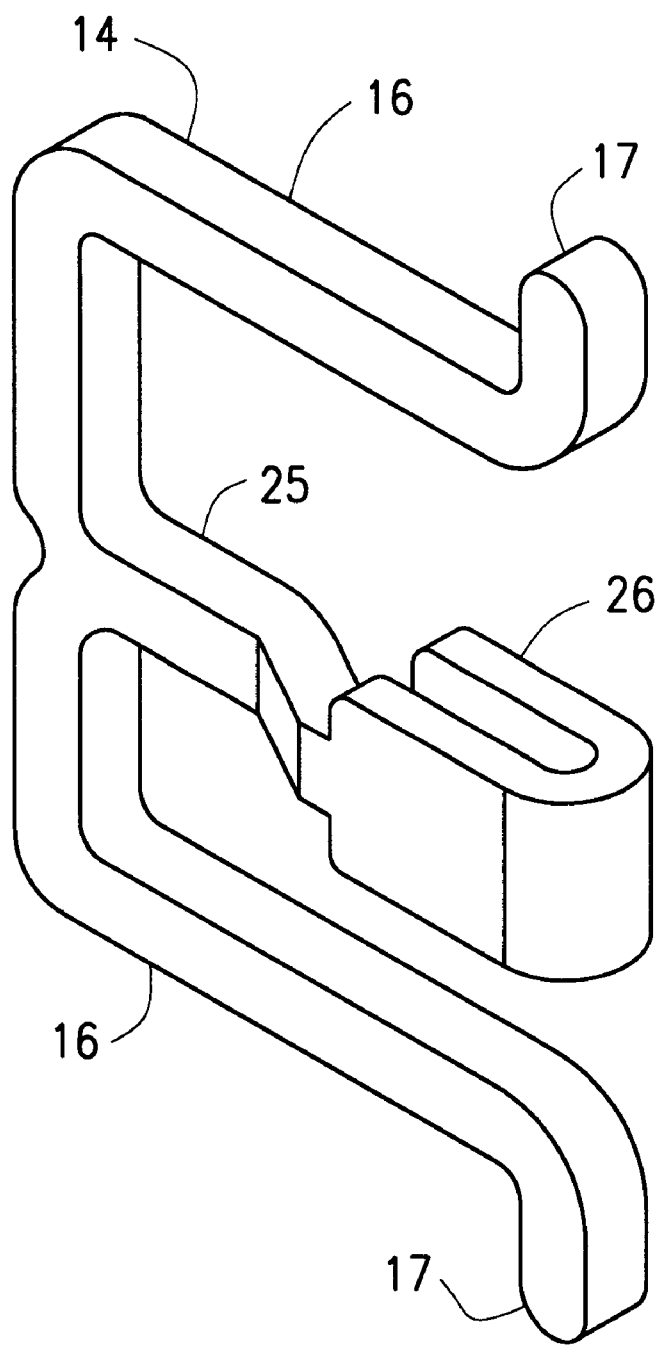
FIG. 8 is a perspective view of a single contact of the invention.

FIG. 8 shows a contact drawn in isolation with its parts marked with the same reference characters as those used in FIGS. 6 and 7. The contact 14 may be formed of a material having good electrical conducting properties and good resiliency or spring properties, such as beryllium copper, and the actual points of contact with the contact pads of a printed circuit board may be plated with gold or other materials for establishing good electrical contact.

Figure 9:
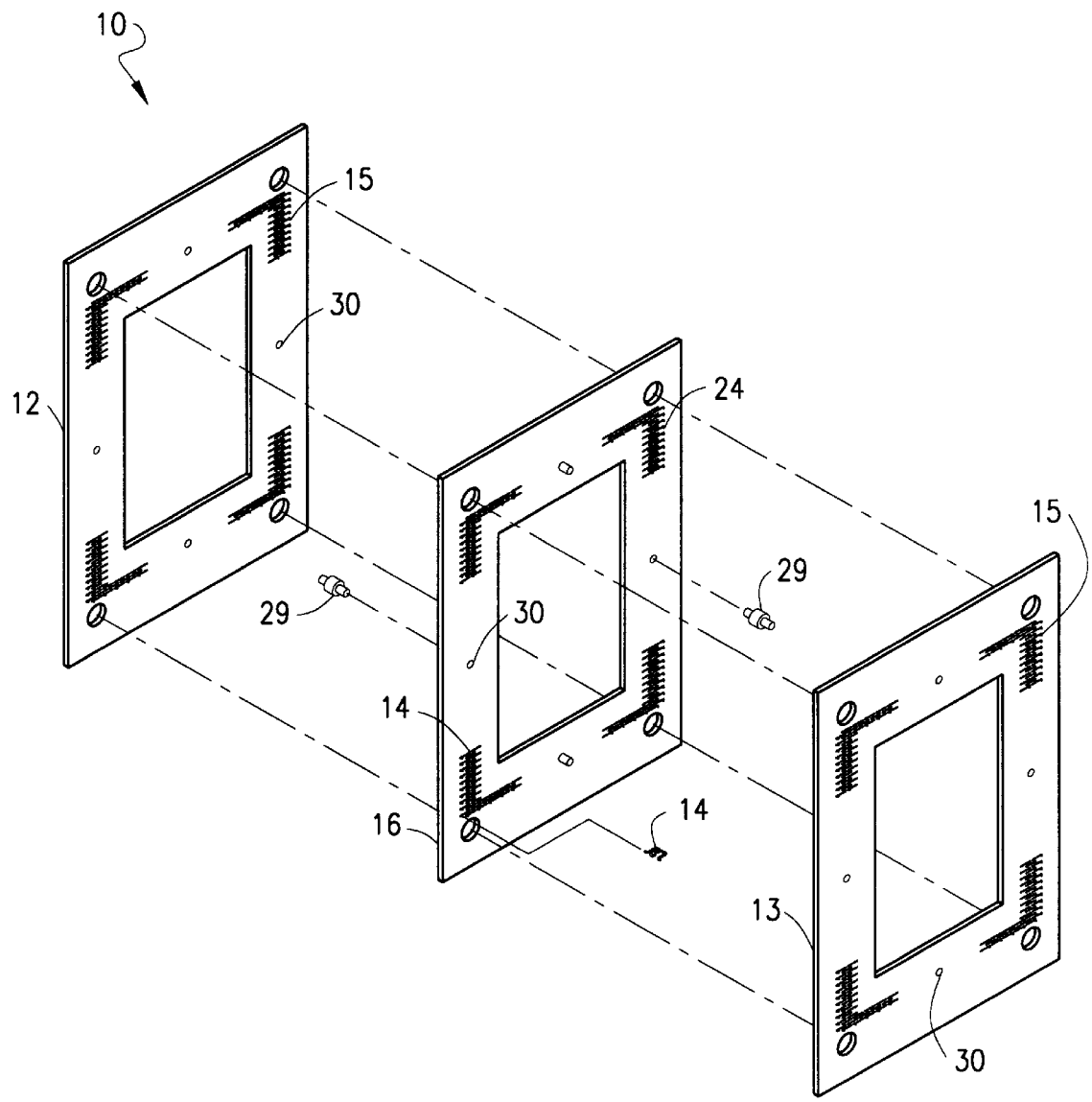
FIG. 9 is an exploded view in perspective of the connector of FIG. 1.

FIG. 9 shows the connector 10 of FIG. 1 in exploded form, with all but one of the contacts 14 installed, and with the apertures 24 and 15 in the sheets shown. Also seen in FIG. 9 are spacer means 29 which fit into holes 30 in the sheets to help establish a uniform thickness to the laminate when it is formed. Spacer means 29 are preferably longer than the combined thickness of the three sheets so that they, and not the sheets, establish the spacing between circuit boards.

Figure 10:
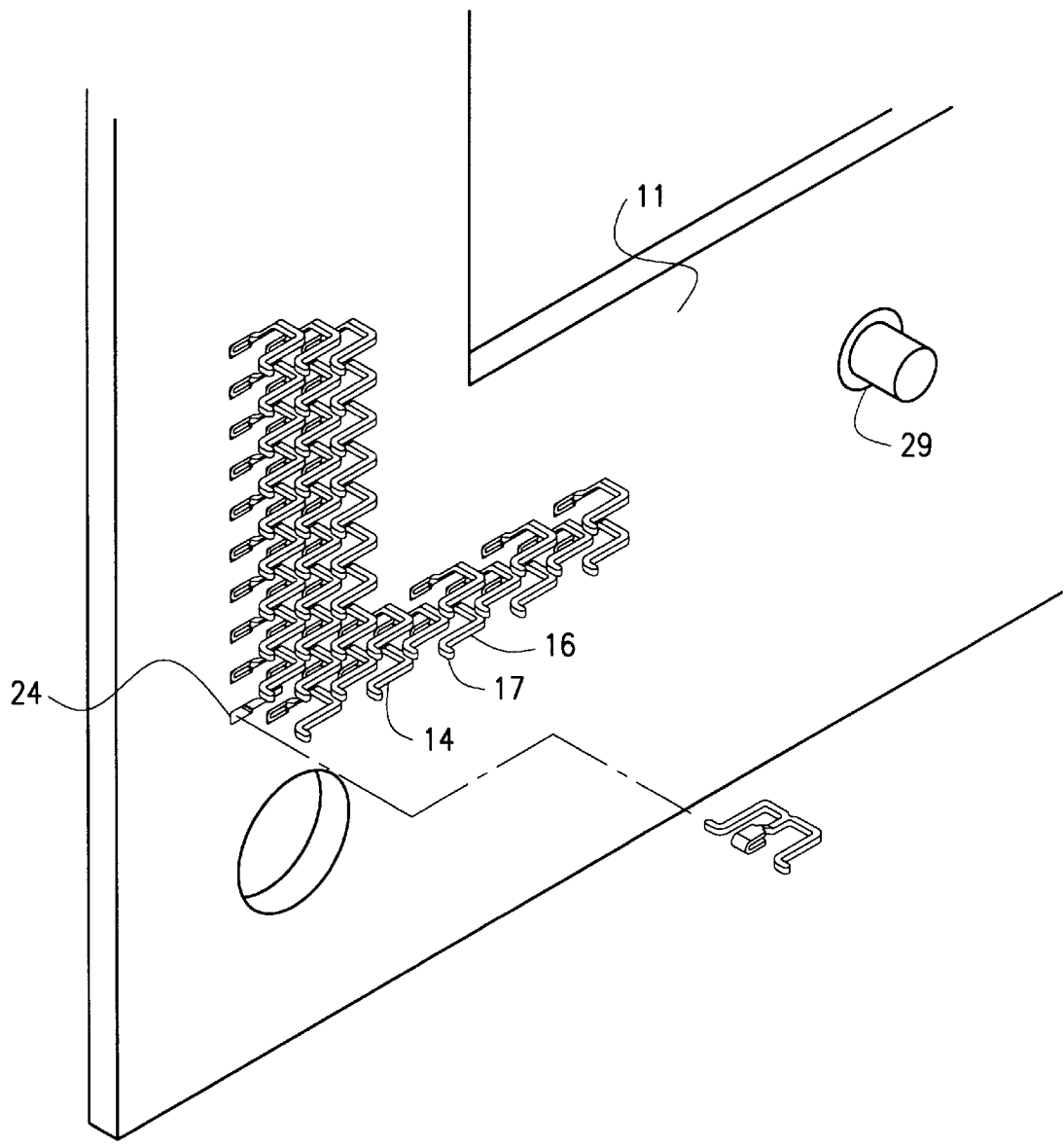
FIG. 10 is an enlarged view of a portion of the contact mounting sheet forming the middle layer of the laminated connector of FIG. 9.

FIG. 10 shows a contact mounting sheet 11 having slots 24 in it. Contacts 14 are shown mounted in the slots or apertures in sheet 11. It can be seen that the legs 16 terminating in heads 17 project outwardly from the face of the contact mounting sheet 11. It can also be seen that aperture 24 in sheet 11 is contoured in profile to accommodate the enlarged end portion 26 of leg 25.

Figure 11:
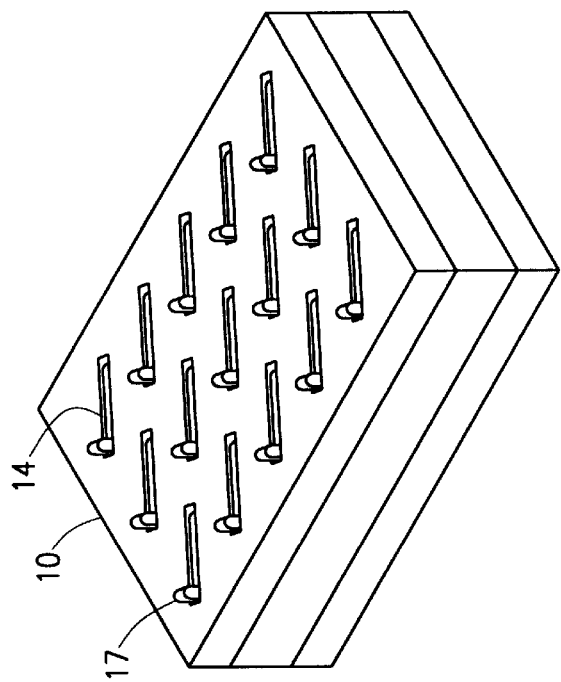
FIG. 11 is a perspective view of a connector showing the contacts in rectangular array, but with the individual contacts skewed in accordance with the invention.

FIG. 11 shows a portion of a connector 10 in which the contact heads 17 of the several connectors 14 are arranged in a rectangular grid. The spacing of the grid is such that it is smaller than the linear length of a contact, and for this reason, in accordance with the invention, the contacts are skewed with respect to the rectangular layout so that they do not interfere with the tightly arranged rectangular array.

Figure 12:
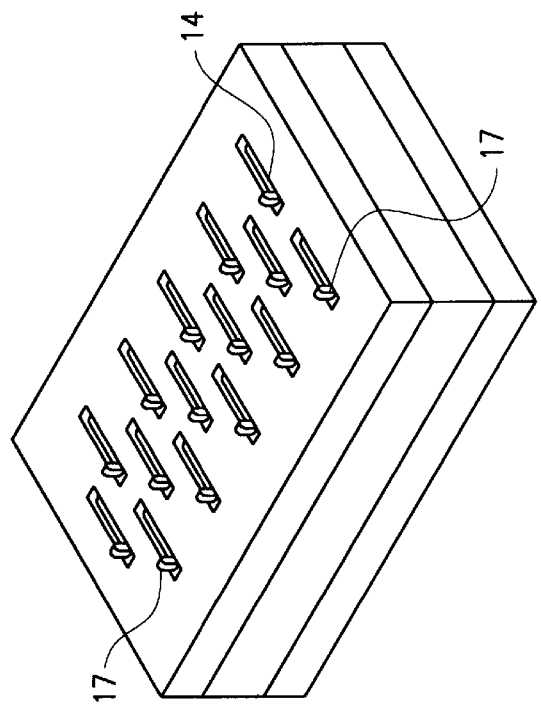
FIG. 12 is a perspective view of a connector showing the contacts arranged in staggered or triangular array.

FIG. 12 shows an arrangement of contacts 14 which is preferred to that of FIG. 11. In this arrangement, the contact heads 17 are in a staggered or triangular pattern. This makes for ease of manufacture.

Figure 13:
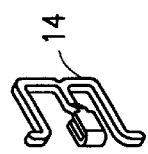
FIG. 13 is another perspective view of a single contact of the invention drawn to the same scale as FIGS. 11 and 12.

FIG. 13 shows a contact 14 drawn to the same scale as the contacts in FIGS. 11 and 12.

In accordance with the method aspect of the invention, it is preferred that the apertured sheets 11, 12 and 13 not be molded, as is conventional, but rather that the sheets be cut from larger stock and the apertures machined in them by numerically controlled laser or equivalent techniques. This is advantageous because the area array connectors are most often needed in relatively small numbers for a given design, and conventional tooling would be excessively costly. In addition, this manufacturing method provides very great flexibility in the choice of number, size, shape, and positioning of the apertures, thus facilitating custom design of small production lots.

What is claimed is:

1. An area array connector adapted to connect contact pads on one generally planar circuit element to corresponding contact pads on another generally planar circuit element comprising:

an insulative contact mounting sheet having a plurality of contact mounting apertures therein;

a plurality of electrically conducting contacts mounted in said contact mounting apertures, each contact having contact pad engaging legs resiliently projecting away from opposite faces of said contact mounting sheet;

two insulative contact securing sheets, one laminated to each face of said contact mounting sheet, each contact securing sheet having apertures therein to accommodate the resiliently projecting legs of said contacts;

in which each of said electrically conducting contacts comprises a base leg adapted and proportioned to fit in and engage the contact mounting apertures of said contact mounting sheet and two pad engaging legs cantilevered resiliently outwardly from said base leg in opposite directions;

in which said pad engaging legs of said contacts have a shorter linear extent than the base legs of said contacts; and in which said contact mounting apertures are each greater in linear extent than the corresponding apertures of said contact securing sheets.

2. A connector in accordance with claim 1 in which said contacts are aligned with one another in a staggered pattern.

3. A connector in accordance with claim 1 in which said contacts are aligned with one another in a rectangular array, in which the spacing between adjacent contact projecting leg ends is less than the length of a projecting contact leg, and further in which said contacts are skewed with respect to the alignment of said rectangular array to accommodate the length of said projecting contact leg.

4. An assembly of a plurality of generally planar circuit elements having contact pads on at least one surface thereof, said circuit elements being stacked one upon another, with area array connectors being interleaved between adjacent circuit elements, said area array connectors each comprising:

an insulative contact mounting sheet having a plurality of contact mounting apertures therein;

a plurality of electrically conducting contacts mounted in said contact mounting apertures, each contact having contact pad engaging legs resiliently projecting away from opposite faces of said contact mounting sheet;

two insulative contact securing sheets, one laminated to each face of said contact mounting sheet, each contact securing sheet having apertures therein to accommodate the resiliently projecting legs of said contacts; and framing means for holding said assembly together and for establishing pressure contact between said contact pads and corresponding contact pad engaging legs;

spacer means mounted in said sheets to establish and maintain a uniform thickness of said connector; and said spacer means having a length greater than the combined thickness of said sheets.

5. An assembly in accordance with claim 4 in which said plurality of generally planar circuit elements comprises three or more of said elements.

6. An assembly in accordance with claim 5 and further comprising spacer means mounted in said sheets to establish and maintain a uniform thickness of said connector.

7. An assembly in accordance with claim 6 in which said spacer means have a length greater than the combined thickness of said sheets.

* * * * *

UNITED STATES PATENT AND TRADEMARK OFFICE
CERTIFICATE OF CORRECTION

PATENT NO. : 6,220,869 B1
DATED : April 24, 2001
INVENTOR(S) : John L. Grant et al.

It is certified that error appears in the above-identified patent and that said Letters Patent is hereby corrected as shown below:

Column 3,
Line 26, replace "Sheet 1" with -- Sheet 11 --

Signed and Sealed this

Eleventh Day of December, 2001

*Attest:*

*Attesting Officer*

NICHOLAS P. GODICI
*Acting Director of the United States Patent and Trademark Office*